US008110923B2

United States Patent
Watanabe

(10) Patent No.: US 8,110,923 B2
(45) Date of Patent: Feb. 7, 2012

(54) SEMICONDUCTOR DEVICE AND METHOD OF MANUFACTURING THE SAME

(75) Inventor: Kiyonori Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 5 days.

(21) Appl. No.: 12/851,566

(22) Filed: Aug. 6, 2010

(65) Prior Publication Data

US 2011/0037147 A1    Feb. 17, 2011

(30) Foreign Application Priority Data

Aug. 17, 2009 (JP) ................................. 2009-188510

(51) Int. Cl.
*H01L 23/48* (2006.01)
(52) U.S. Cl. ......... 257/739; 257/E23.179; 257/E21.536; 438/613; 438/666
(58) Field of Classification Search .................. 257/739, 257/E23.179, E21.563; 438/613, 666
See application file for complete search history.

(56) References Cited

U.S. PATENT DOCUMENTS 7,830,011 B2 * 11/2010 Nomoto et al. ............... 257/758
7,884,472 B2 *  2/2011 Chen et al. .................... 257/737

FOREIGN PATENT DOCUMENTS

| JP | 2001-156209 | 6/2001 |
| JP | 2004-241696 | 8/2004 |

* cited by examiner

*Primary Examiner* — Trung Q Dang
(74) *Attorney, Agent, or Firm* — Volentine & Whitt, PLLC

(57) ABSTRACT

An improved manufacturing method of a semiconductor device is provided. The method includes preparing a semiconductor substrate having an integrated circuit together with connection pads. The method also includes forming a dielectric film on the semiconductor substrate. The method also includes forming connection wires having a predetermined pattern on the dielectric film such that the connection wires are electrically connected to the connection pads. The method also includes forming a surface resin layer to partially cover the connection wire. The method also includes forming a metal film over the exposed connection wires. The method also includes forming a display unit having through holes to present identification information in a region corresponding to the center area of the semiconductor substrate on the surface resin layer. The forming of the metal film and the forming of display unit are carried out simultaneously.

20 Claims, 5 Drawing Sheets

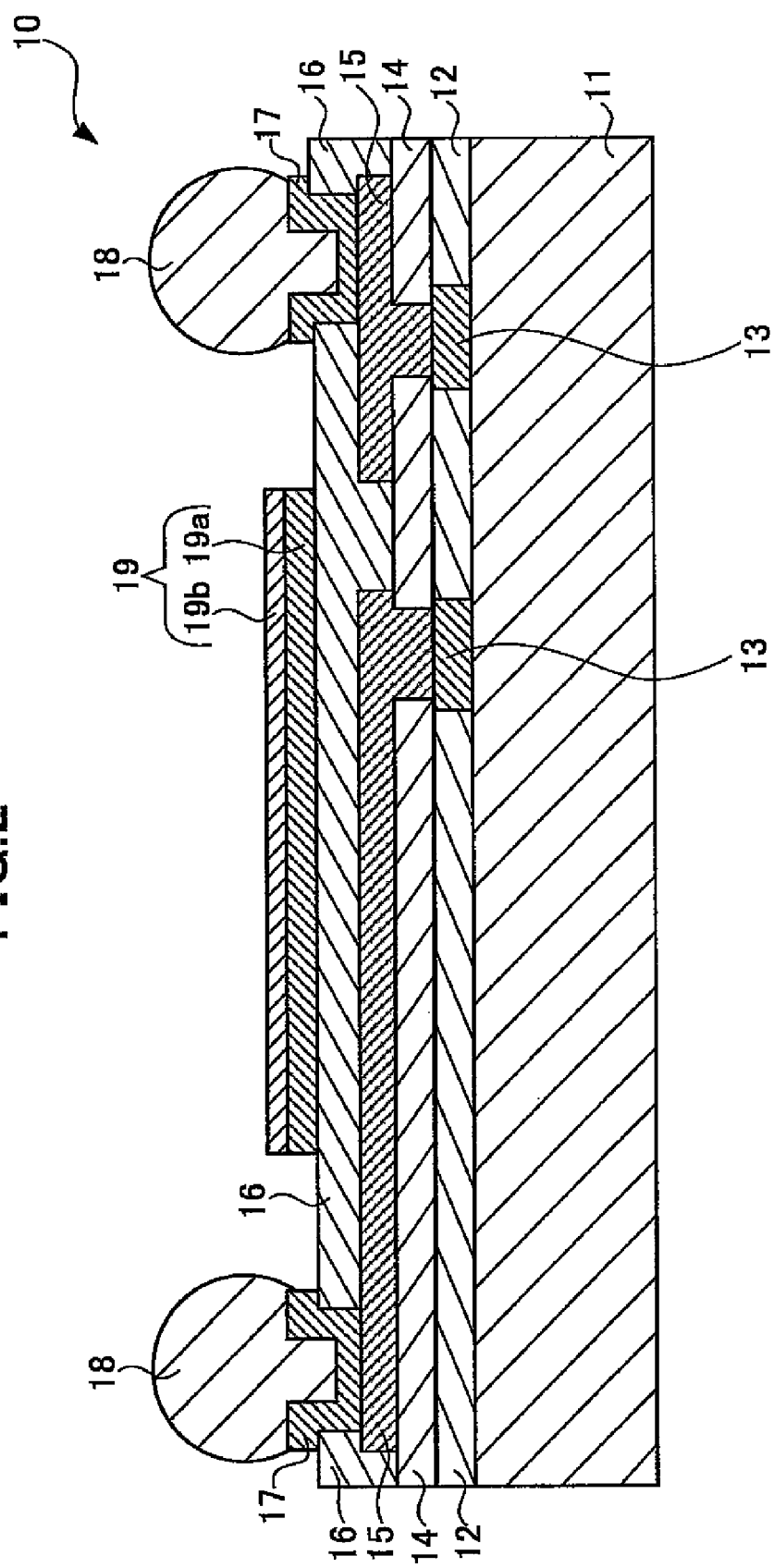

SEMICONDUCTOR DEVICE AND METHOD OF MANUFACTURING THE SAME

BACKGROUND OF THE INVENTION

1. Field of the Invention

The present invention relates to a manufacturing method of a semiconductor device and a resulting semiconductor device, and more particularly to a method of manufacturing a semiconductor device called a chip scale package or a chip size package (CSP).

2. Description of the Related Art

In recent years, the reduction in size and weight of electronic appliances, such as mobile phones, mobile computers, personal digital assistants (PDAs), home video cameras, and digital cameras, and peripherals of these electronic appliances has been rapidly accomplished. According to such market trend, there is a high necessity for reducing the size, thickness and weight of a semiconductor chip used in the electronic appliances and for mounting the semiconductor chip on a micro wire board at high density. In order to satisfy such necessities, a chip size semiconductor device or a package size device slightly larger than the chip size semiconductor device, i.e., a so-called a chip scale package or a chip size package (CSP), is under development.

The CSP is advantageous in that the CSP is subminiaturized and thin, and the CSP can be mounted on a printed board using well-known surface mounting technology. Also, the CSP is advantageous in that a semiconductor chip is mounted as a package structure, and therefore it is possible to ensure high-quality mounting, as compared with bare chip mounting technology for directly mounting the semiconductor chip on the printed board.

A CSP and a manufacturing method thereof are disclosed, for example, in Japanese Patent Application Kokai (Laid-Open) No. 2001-156209 and Japanese Patent Application Kokai No. 2004-241696. According to the disclosures of Japanese Patent Application Kokai No. 2001-156209 and Japanese Patent Application Kokai No. 2004-241696, a plurality of protruding electrodes are formed on a dielectric film (insulation film) and wires stacked on a semiconductor substrate, and a conductor layer is formed around the protruding electrodes. It is possible to prevent electromagnetic noise generated in a circuit element forming region from leaking to the outside and to reduce influence of electromagnetic noise from the outside and influence of optical noise from the outside by the provision of the conductor layer.

SUMMARY OF THE INVENTION

In the conventional CSP, necessary information (e.g., product name, lot number, and manufacturer name) of a individual package is indicated at the inside of the package (i.e., the information is printed on the surface of the semiconductor substrate) by laser printing or ink printing. Thus, the size of print dots should be reduced according to the reduction of the package size. However, it is not possible to print the necessary product information in a sufficient manner if the print dot size to be used is too small. Also, positioning of the package on the basis of the package upper or front surface (the protruding electrode forming side) is difficult, and therefore printing position misalignment occurs when printing is made on the rear or back surface of the package. In addition, because the printing process for presenting only the product information needs to be carried out after the formation of the protruding electrodes, a separate printing process is required, and it is difficult to reduce manufacturing time and manufacturing costs.

It is an object of the present invention to provide an improved method of manufacturing a semiconductor device that is capable of accurately and easily presenting identification information, such as product information, on a package without performing a separate printing process.

In accordance with a first aspect of the present invention, there is provided a manufacturing method of a semiconductor device that includes preparing a semiconductor substrate having an integrated circuit with a plurality of connection pads. The method also includes forming a dielectric film having a plurality of first contact holes, through which the connection pads are exposed, on the semiconductor substrate. The method also includes forming connection wires having a predetermined pattern on the dielectric film such that the first contact holes are filled with the connection wires and the connection wires are electrically connected to the connection pads. The method also includes forming a surface resin layer over the connection wires. The surface resin layer has a plurality of second contact holes, through which the surfaces of the connection wires are partially exposed, in a region corresponding to a perimeter of the semiconductor substrate. The method also includes forming a metal film to cover at least the bottoms of the second contact holes. The method also includes forming a display unit having a plurality of through holes that represent identification information in a region corresponding to the center area of the semiconductor substrate on the surface resin layer. The forming of the metal film and the forming of the display unit are carried out simultaneously. The metal film is used to electrically connect the connection wires with external connection terminals.

The method carries out the metal film forming step and the display unit forming step in a single process, without displaying (or printing) the identification information on the semiconductor substrate. Consequently, it is possible to accurately and easily present necessary identification information, such as product information, on a package. The step of providing the display unit is included in the step of providing the metal film (i.e., there is no separate step of forming the display unit). Thus, it is possible to reduce manufacturing time and product costs.

In accordance with a second aspect of the present invention, there is provided a semiconductor device that includes a semiconductor substrate provided with an integrated circuit. A plurality of connection pads are formed on the semiconductor substrate. The semiconductor device also includes a dielectric film having a plurality of first contact holes through which the connection pads are exposed. The semiconductor device also includes connection wires having a predetermined pattern on the dielectric film such that the first contact holes are filled with the connection wires and the connection wires are electrically connected to the connection pads. The semiconductor device also includes a surface resin layer over the connection wires. The surface resin layer has a plurality of second contact holes, through which the surfaces of the connection wires are partially exposed, in a region corresponding to the perimeter of the semiconductor substrate. The semiconductor device also includes a metal film provided to cover at least the bottoms of the second contact holes. External connection terminals are formed on the metal film. The semiconductor device also includes a display unit formed on the surface resin layer in a region surrounded by the metal film and the external connection terminals. The display unit has a plurality of through holes to represent identification information.

It is possible for the semiconductor device to show the product information through the display unit. Because the display unit is provided in the center area of the product, the semiconductor device exhibits high resistance to electrical noise, optical noise, and mechanical impact from the outside.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 2 is a partially enlarged cross-sectional view of the semiconductor device shown in FIG. 1, taken along the line 2-2 in FIG. 1.

DETAILED DESCRIPTION OF THE INVENTION

Hereinafter, embodiments of the present invention will be described in detail with reference to the accompanying drawings.

First, the structure of a semiconductor device according to an embodiment of the present invention will be described in detail with reference to FIGS. 1 and 2.

Figure 1:
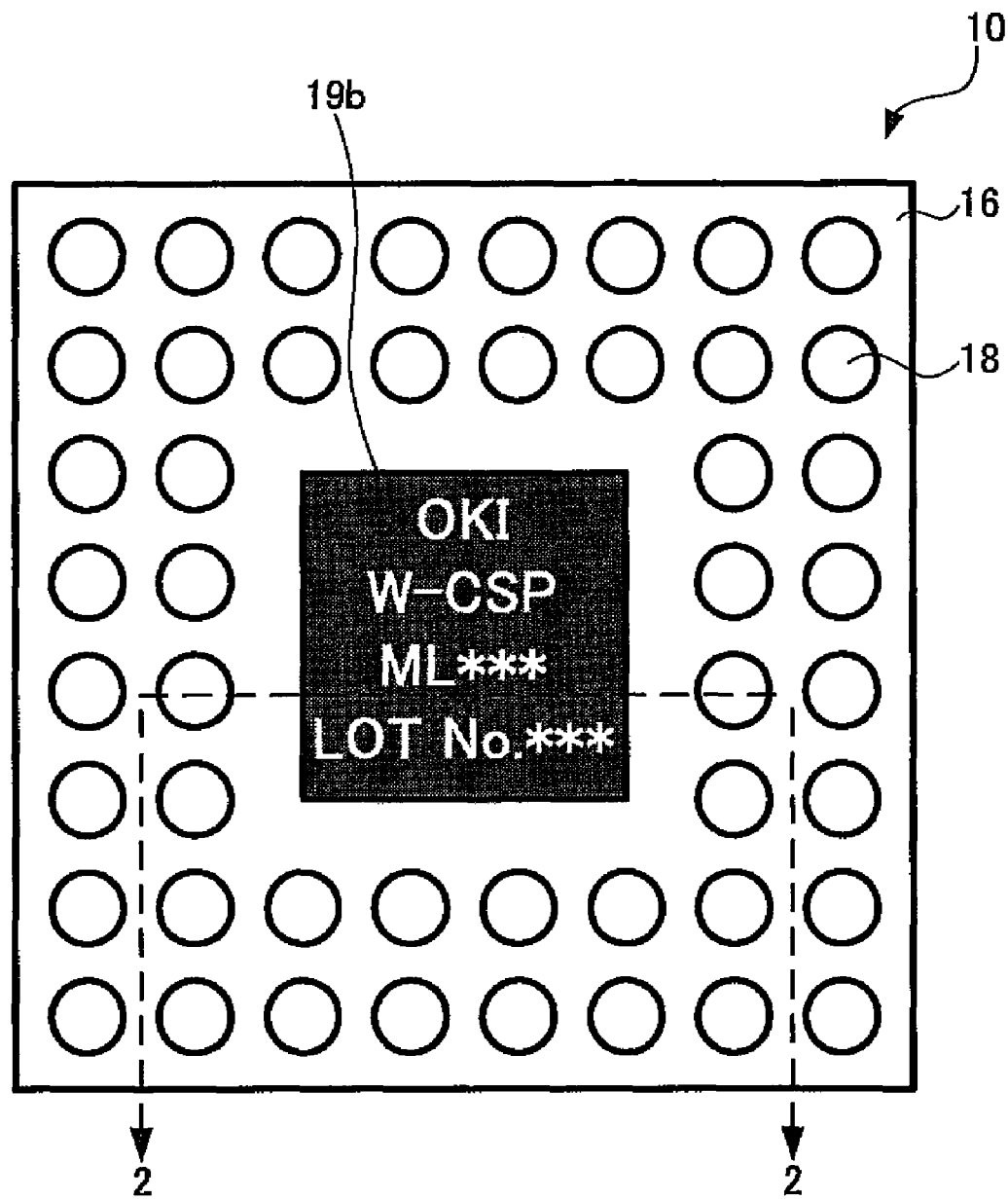
FIG. 1 is a plan view of a semiconductor device according to an embodiment of the present invention.

As shown in FIGS. 1 and 2, a semiconductor device 10 includes a semiconductor substrate 11, a passivation film 12, connection pads 13, an interlayer dielectric film 14, connection wires 15, a surface resin film 16, a heat diffusion preventing film 17, external connection terminals 18, and a display unit 19. The display unit 19 includes a first display film 19a and a second display film 19b.

As shown in FIG. 1, the semiconductor device 10 is formed in a square shape. A plurality of external connection terminals 18 are arranged in two rows along the perimeter of the surface resin film 16. The second display film 19b is provided in the center area of the surface resin film 16. The second display film 19b is surrounded by the external connection terminals 18.

"OKI W-CSP ML* LOT No. *" is presented or displayed on the second display film 19b. The displayed contents include identification information (product information) such as a manufacturer of the semiconductor device, kind of a product, name of the product, and a lot number. The identification information is made in a manner as described below. A plurality of through holes, each having a predetermined shape when viewed from the top, are formed in the second display film 19b, and the letters, symbols and numbers of the identification information are defined by the planar shapes of the through holes. That is, letter and symbol portions indicated on the second display film 19b of FIG. 1 are constituted by the through holes. It should be noted that the identification information is not limited to the above-described information. For example, the identification information may include type and size of the product and place of production. Also, the identification information is not limited to ones displayed by letters, numbers, and symbols. For example, the identification information may be a two-dimensional bar code.

Although not shown in FIG. 2, another set of through holes are formed in the first display film 19a such that the through holes of the first display film 19a communicate with the through holes of the second display film 19b. Consequently, the through holes are provided in the combined display unit 19 (combination of the first and second display units 19a and 19b) to display or present the identification information.

Next, the components of the semiconductor device 10 will be described with reference to FIG. 2. The semiconductor substrate 11 is made of silicon. At the surface and the interior of the semiconductor substrate 11 is formed an integrated circuit (not shown) including a drain region, a drain electrode, a source region, a source electrode, a gate dielectric film, a gate electrode, an element separation region, and a dielectric film. The dielectric film covers the drain region, the drain electrode, the source region, the source electrode, the gate dielectric film, the gate electrode, and the element separation region.

The passivation film 12 is formed on the semiconductor substrate 11. The passivation film 12 serves to protect the integrated circuit formed at the semiconductor substrate 11 from physical damage caused by a pincette, chemical damage caused by chemicals, and electric damage caused by electrostatic breakdown. The passivation film 12 is made of an insulation material such as $SiO_2$, phosphor silicate glass (PSG) or $Si_3N_4$.

Openings are formed at predetermined positions of the passivation film 12. The openings are filled to constitute the connection pads 13. The connection pads 13 are connected to the respective element regions or the respective electrodes of the integrated circuit. The connection pads 13 are, for example, made of a dielectric material such as aluminum, copper-added aluminum, or tungsten.

The interlayer dielectric film 14 is provided to cover the entire surface of the passivation film 12 and a portion of the surface of each of the connection pads 13. First contact holes are formed in the interlayer dielectric film 14 such that the first contact holes vertically extend from the connection pads 13 respectively. The interlayer dielectric film 14 is made of $SiO_2$.

The first contact holes formed in the interlayer dielectric film 14 are filled with connection wires 15. Also, the connection wires 15 are formed on the surface of the interlayer dielectric film 14 such that the connection wires 15 have a predetermined wire pattern. Since the connection wires 15 fill the first contact holes, the connection wires 15 are electrically connected to the connection pads 13. The connection wires 15 are therefore electrically connected to the respective element regions or the respective electrodes of the integrated circuit via the connection pads 13. The connection wires 15 are made of a dielectric material such as copper or aluminum-added copper.

The surface resin film 16 is formed on the surface of the interlayer dielectric film 14 and on the surfaces of the connection wires 15. Second contact holes are provided at predetermined positions in the surface resin film 16 such that the connection wires 15 are exposed through the second contact holes. The surface resin film 16 is made of a resin, such as polyimide resin, silicon modified polyimide resin, epoxy resin, silicon modified epoxy resin, benzocyclobutene (BCB), or polybenzoxazole (PBO).

The heat diffusion preventing film 17 is formed at the bottoms (i.e., the exposed portions of the connection wires 15) of the second contact holes provided in the surface resin film 16, the sides of the second contact holes, and portions of the surface of the surface resin film 16. The heat diffusion preventing film 17 is provided to prevent the diffusion of heat from metal elements, such as copper, which is the material for the connection wires 15, and tin, which is the material for the external connection terminals 18. The heat diffusion preventing film 17 is made of nickel. The external connection terminals 18 are formed on the heat diffusion preventing film 17. The external connection terminals 18 are solder balls made of tin-silver alloy solder.

The first display film 19a is formed on the surface of the surface resin film 16 in a region surrounded by the external connection terminals 18 (a display unit forming region). The second display film 19b is formed on the first display film 19a. The first display film 19a is made of the same material as the heat diffusion preventing film 17, and the second display film 19b is made of the same material as the external connection terminals 18. That is, the first display film 19a is made of nickel, and the second display film 19b is made of a tin-silver alloy. Since the first display film 19a and the second display film 19b do not extend over the entire surface of the surface resin film 16, some recesses or through holes are defined, and the surface resin film 16 is exposed in the recesses.

In the semiconductor device 10 according to this illustrated embedment, the identification information is not printed on the semiconductor substrate 11 using a laser printing method or an ink printing method, but the display unit 19 is provided at the side at which the external connection terminals 18 are formed. Also, the display unit 19 has a two-layer structure made of a dielectric material. The semiconductor device 10 exhibits high resistance to electrical noise, optical noise, and mechanical impact from the outside by the provision of the display unit 19.

Next, a manufacturing method of a semiconductor according to an embodiment of the present invention will be described in detail with reference to FIG. 3A to FIG. 3D, FIG. 4A to FIG. 4C and FIG. 5A to FIG. 5C.

Figure 3A:
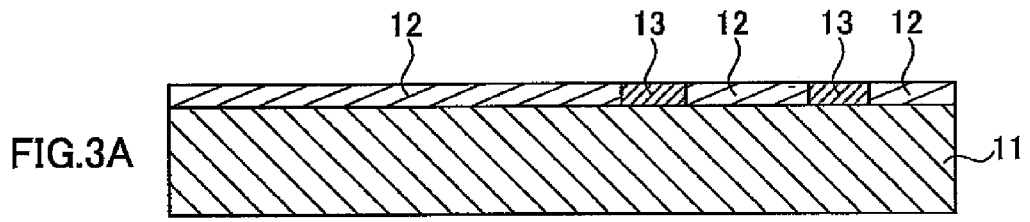
FIGS. 3A to 3D, FIGS. 4A to 4C and FIGS. 5A to 5C are a series of partially enlarged cross-sectional views illustrating respective steps of a manufacturing method of a semiconductor device according to one embodiment of the present invention.

First, a semiconductor substrate 11, the surface of which is covered by a passivation film 12 and connection pads 13, is prepared (FIG. 3A). The semiconductor substrate 11 is made of silicon. In the interior and on the surface of the semiconductor substrate 11 is formed an integrated circuit (not shown) including a drain region, a drain electrode, a source region, a source electrode, a gate dielectric film, a gate electrode, an element separation region, and a dielectric film. The dielectric film covers the drain region, the drain electrode, the source region, the source electrode, the gate dielectric film, the gate electrode, and the element separation region. The integrated circuit is formed in the prepared semiconductor substrate using well-known integrated circuit forming technology. After that, aluminum or copper-added aluminum is deposited using a sputtering method to provide the connection pads 13 that are electrically connected to the respective regions and the respective electrodes of the integrated circuit. The passivation film 12 is formed on the surface of the semiconductor substrate 11 at a region where the connection pads 13 are not formed using a chemical vapor deposition (CVD) method.

Figure 3B:
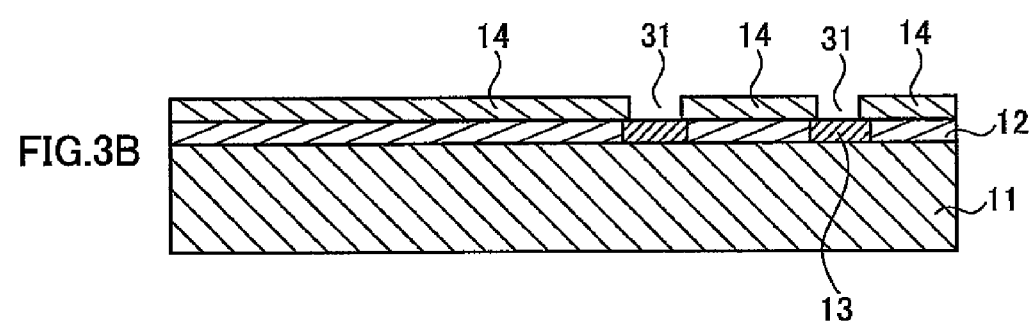

Next, an interlayer dielectric film 14 having first contact holes 31, through which the connection pads 13 are exposed, are formed on the surface of the passivation film and on the surfaces of the respective connection pads (FIG. 3B). More specifically, a thin film, which is made of $SiO_2$, is provided using a CVD method such that the entire surface of the passivation film 12 and the entire surfaces of the respective connection pads 13 are covered by the thin film. Subsequently, a resist is applied to the thin film. A predetermined patterning process is performed with respect to the resist using photolithography such that the resist is left only on the connection pads 13. A dry etching process is performed using the patterned resist as a mask to form first contact holes 31 in the thin film. As a result, an interlayer dielectric film 14 having the first contact holes 31, through which the connection pads 13 are partially exposed, is formed. The resist is removed after the formation of the interlayer dielectric film 14.

Figure 3C:
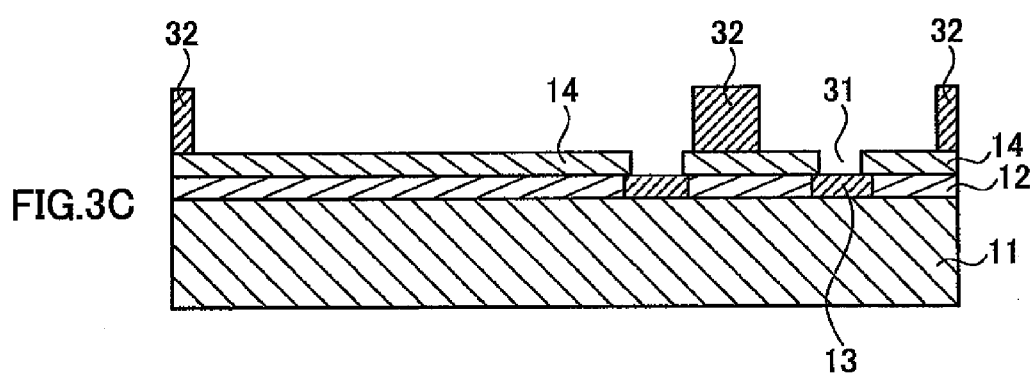
Figure 3D:
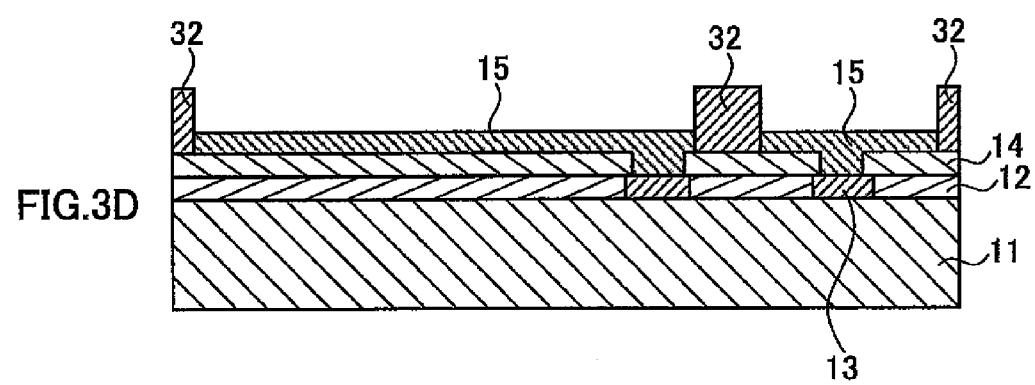

Next, a resist 32 is applied to cover the interlayer dielectric film 14. Subsequently, a predetermined patterning process is performed with respect to the resist 32 using photolithography (FIG. 3C). In addition, a metal, such as copper or aluminum-added copper, is deposited by a sputtering method using the patterned resist 32 as a mask. As a result, connection wires 15 are provided such that the first contact holes 31 are filled with the connection wires 15 and the surface of the interlayer dielectric film 14 is covered by the connection wires 15 (FIG. 3D). After that, the resist 32 is removed.

Figure 4A:
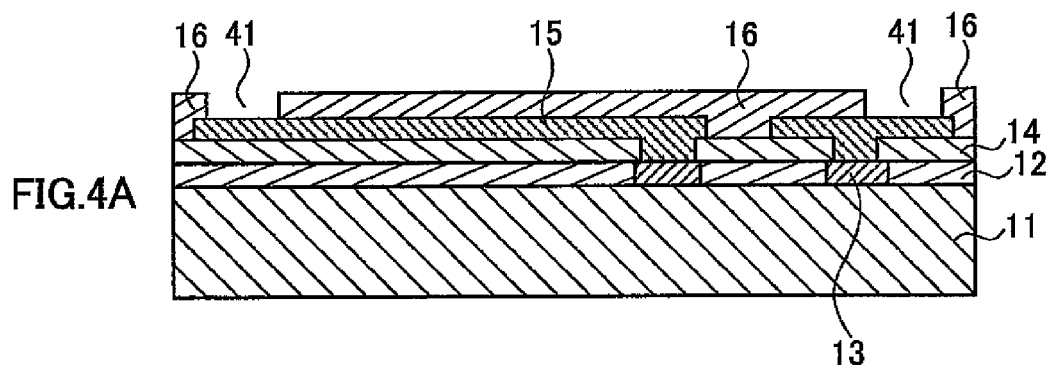

Next, a resin, such as polyimide resin, silicon modified polyimide resin, epoxy resin, silicon modified epoxy resin, benzocyclobutene (BCB), or polybenzoxazole (PBO), is applied to cover the connection wires 15. In addition, second contact holes 41 are formed at predetermined positions such that the connection wires 15 are partially exposed. The predetermined positions correspond to the perimeter of the semiconductor substrate 11 (In FIG. 4A, the second contact holes 41 are located above the perimeter of the substrate 11). As a result, a surface resin film 16 having the second contact holes 41, through which the connection wires 15 are exposed, is formed (FIG. 4A).

Figure 4B:
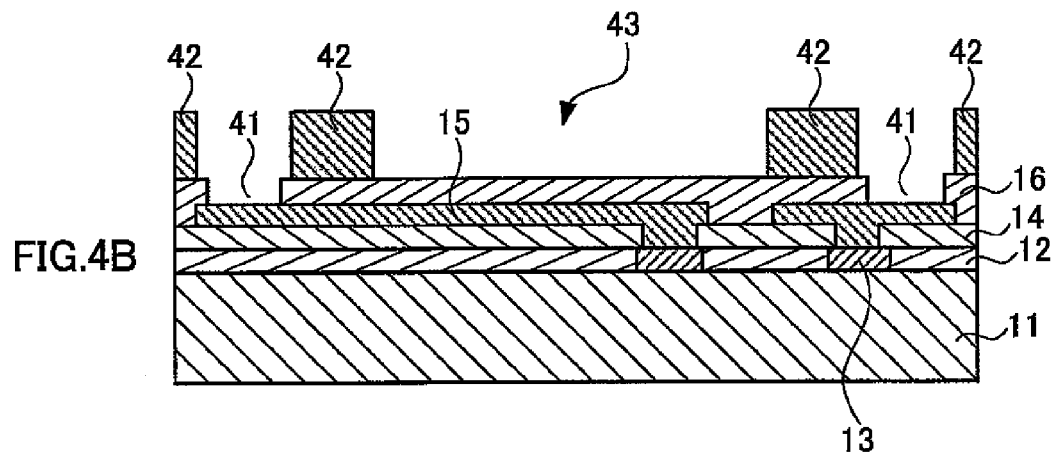

Next, a resist 42 is applied to cover the surface resin film 16. Subsequently, a predetermined patterning process is performed with respect to the resist 42 using photolithography. As a result, a display unit forming region 43 is defined in the center area above the semiconductor substrate 11 (FIG. 4B). The patterned resist 42 has a shape to indicate "OKI W-CSP ML* LOT No. *" as shown in FIG. 1. A square region (19b in FIG. 1) around the resist 42 is the display unit forming region 43.

Figure 4C:
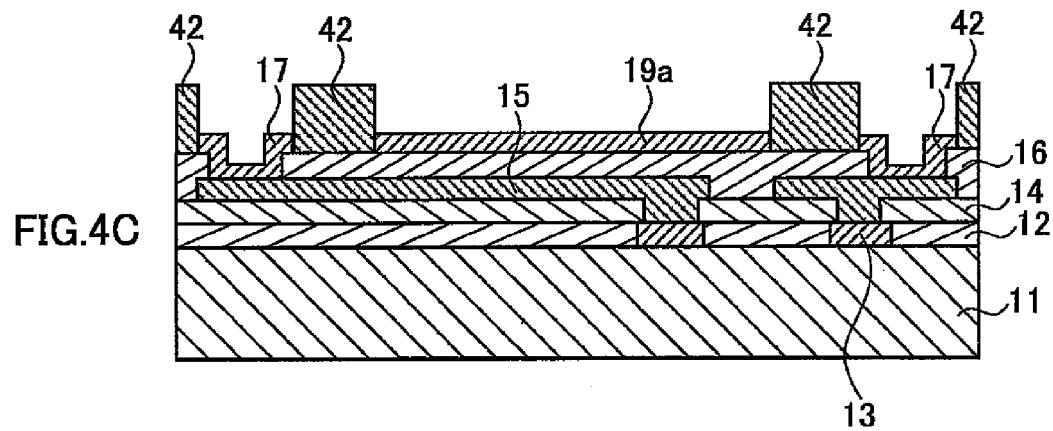

Next, a metal, such as nickel, is deposited by a plating method using the patterned resist 42 as a mask. This metal (e.g., nickel) is able to prevent or restrict heat diffusion. As a result, a heat diffusion preventing film 17, which is made of nickel, is formed at the sides and bottoms of the second contact holes 41, and a first display film 19a, which is made of nickel, is formed in the display unit forming region 43 (FIG. 4C).

Figure 5A:
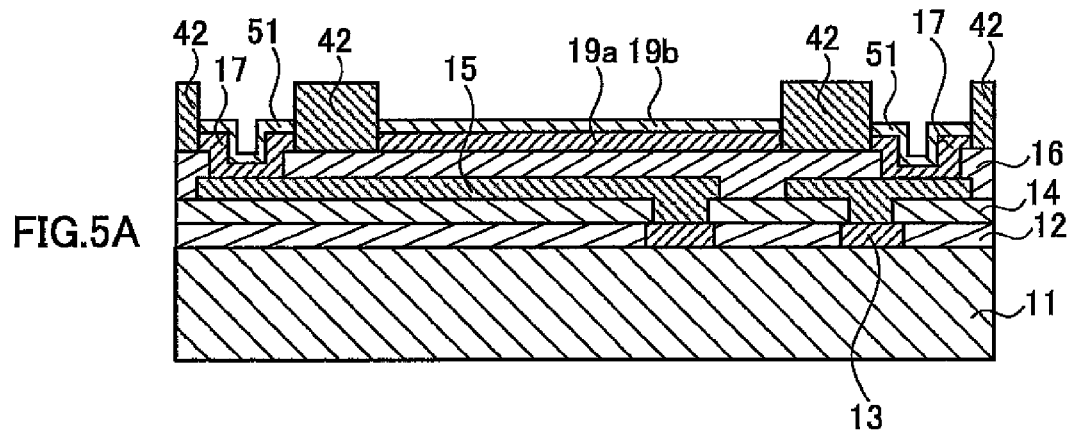

Next, a tin-silver alloy is deposited by a plating method using the patterned resist 42 as a mask. The tin-silver ally prevents natural oxidation of nickel. As a result, an oxidation preventing film 51 is formed on the surface of the heat diffusion preventing film 17, and a second display film 19b is formed on the surface of the first display film 19a (FIG. 5A). The oxidation preventing film 51 can be referred to as passivation film because of its function.

It should be noted that the first display film 19a and the second display film 19b may be formed using other well-known film forming technology, such as a sputtering method, instead of the plating method.

Figure 5B:
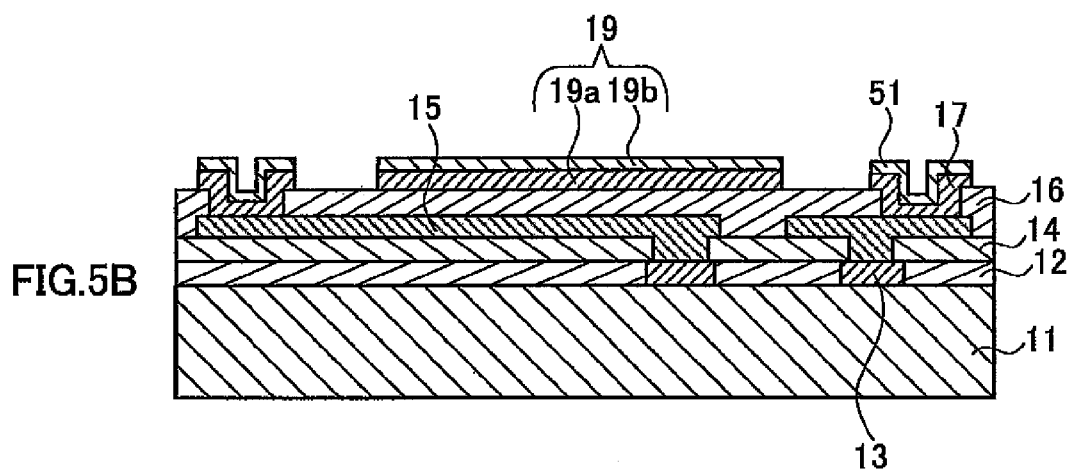
Figure 5C:
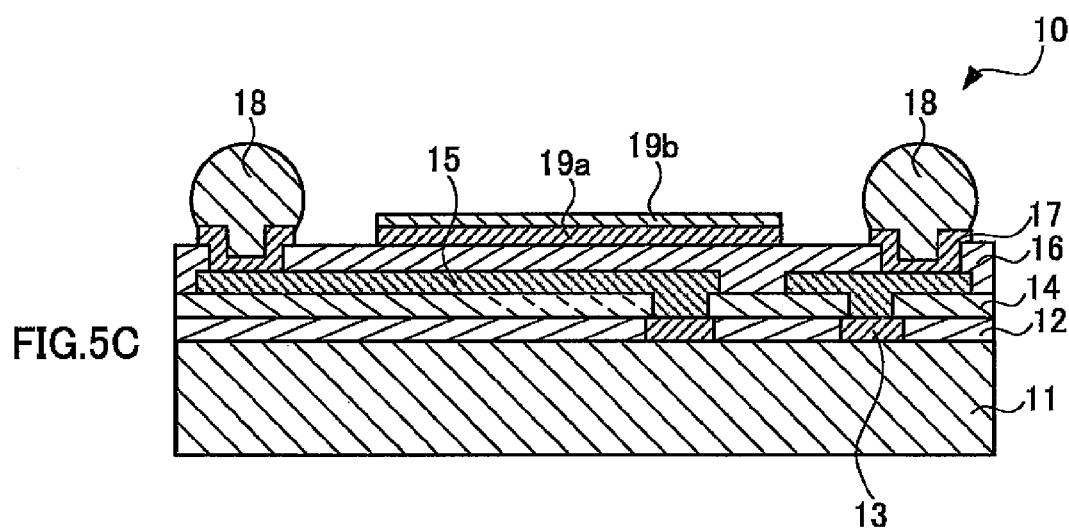

Next, the resist 42 is removed (FIG. 5B). As a result, through holes are made extending vertically through the first display film 19a and the second display film 19b. Accordingly, a display unit 19 to display "OKI W-CSP ML* LOT No. *" as shown in FIG. 1 is formed. That is, identification information is displayed by the planar shape (i.e., the shape viewed from the top) of the through holes that extend through the first display film 19a and the second display film 19b. After the formation of the display unit 19, external connection terminals 18 are formed using solder balls, which are made of a tin-silver alloy (FIG. 5C). Because the oxidation preventing film 51 and the solder balls 18 are made of the same material, the oxidation preventing film 51 and the solder balls are fused to each other during the step of forming the external connection terminals 18. A semiconductor device 10 is completed through the above-described processes.

Because the above-described manufacturing method simultaneously forms the metal film 17 electrically connecting the connection wires 15 with the external connection terminals 18 and the display unit 19a, it is possible to reduce manufacturing time. Because the printing process using photolithography is performed, it is easy to reduce letter size or easy to provide fine letters in the display unit 19. Even when a semiconductor device is miniaturized, it is possible to present or indicate all necessary identification information. Also, it is possible to greatly improve precision in information indicating position, as compared to laser printing or ink printing. Consequently, it is possible to provide a semiconductor device having a high quality and a high yield ratio.

As understood from the foregoing, the manufacturing method of the semiconductor device according to the present invention includes a step of preparing a semiconductor substrate having an integrated circuit with connection pads, a step of forming a dielectric film having first contact holes, through which the connection pads are exposed, on the semiconductor substrate, a step of forming connection wires having a predetermined pattern on the dielectric film such that the first contact holes are filled with the connection wires and the connection wires are electrically connected to the connection pads, a step of forming a surface resin layer over the connection wires such that the surface resin layer has second contact holes, through which the surfaces of the connection wires are partially exposed, in a region corresponding to the perimeter of the semiconductor substrate, a step of forming a metal film over at least the bottoms of the second contact holes and a step of forming a display unit having through holes to display identification information in a region corresponding to a center area of the semiconductor substrate on the surface resin layer. The step of forming the metal film and the step of forming the display unit are carried out simultaneously. The metal film is used to electrically connect the connection wires with external connection terminals.

According to the present invention, it is possible to form the display unit in the same step as the step of forming the metal film without displaying identification information on the semiconductor substrate. Consequently, it is possible to accurately and easily present necessary identification information with respect to a package. In addition, it is not necessary to perform the providing of the identification information in a separate step. This contributes to reduction of manufacturing time and product costs.

The semiconductor device according to the present invention includes a semiconductor substrate provided with an integrated circuit, connection pads formed on the semiconductor substrate, a dielectric film having first contact holes through which the connection pads are exposed, connection wires having a predetermined pattern on the dielectric film such that the first contact holes are filled with the connection wires and the connection wires are electrically connected to the connection pads, a surface resin layer extending over the connection wires and having second contact holes in a region corresponding to the perimeter of the semiconductor substrate such that the surfaces of the connection wires are partially exposed through the second contact holes, a metal film extending over at least the bottoms of the second contact holes, external connection terminals formed on the metal film, and a display unit formed on the surface resin layer in a region surrounded by the metal film and the external connection terminals. The display unit has through holes that represent identification information.

According to the above-described structure of the semiconductor device, it is possible for the semiconductor device to display identification information through the display unit. Because the display unit is provided in the center region of the product, the semiconductor device exhibits high resistance to electrical noise, optical noise, and mechanical impact from the outside.

In the above-described embodiment, the heat diffusion preventing film, the first display film, the second display film, and the oxidation preventing film are formed using photolithography. However, the present invention is not limited in this regard, i.e., the film forming method is not limited to photolithography. For example, a terminal print mask (first print mask) having previously patterned terminal positions and a display print mask (second print mask) having patterned identification information may be used. Alternatively, a print mask having both patterned terminal positions and a patterned display unit position may be used.

It should be noted that a metal underlayer may be formed below the connection wires and the heat diffusion preventing film. The metal underlayer may be made of a titanium-copper alloy.

In the illustrated and described embodiment, the identification information is displayed as letters, numbers, and symbols. It should be noted, however, the identification information may be a two-dimensional bar code. In this configuration, it is possible to employ a parallel-lines pattern for a resist that is used when forming the through holes to represent the identification information. This reduces a defect rate. The two-dimensional bar code may be provided along with the letters, numbers and/or symbols.

It should be noted that the second display part 19b may be dispensed with. In this configuration, the display unit 19 includes the first display part 19a only.

This application is based on Japanese Patent Application No. 2009-188510 filed on Aug. 17, 2009, and the entire disclosure thereof is incorporated herein by reference.

What is claimed is:

1. A manufacturing method of a semiconductor device, comprising:
   preparing a semiconductor substrate having an integrated circuit;
   providing a plurality of connection pads on the semiconductor substrate;
   forming a dielectric film having a plurality of first contact holes, through which the connection pads are exposed, on the semiconductor substrate and the connection pads;
   forming connection wires having a predetermined pattern on the dielectric film such that the first contact holes are filled with the connection wires and the connection wires are electrically connected to the connection pads;
   forming a surface resin layer to cover the connection wires, the surface resin layer having a plurality of second contact holes, through which surfaces of the connection wires are partially exposed, in a region corresponding to a perimeter of the semiconductor substrate; and
   forming a metal film over at least bottoms of the second contact holes, and simultaneously forming a display unit having a plurality of first through holes to represent identification information in a region corresponding to a center area of the semiconductor substrate on the surface resin layer.

2. The manufacturing method according to claim 1, wherein the display unit has a first display film, the first display film is made from a same material as the metal film, and said forming the metal film together with the display unit includes simultaneously forming the metal film and the first display film.

3. The manufacturing method according to claim 2 further comprising:
forming external connection terminals on the metal film after said forming of the metal film and the first display film; and
forming a second display film on the first display film and simultaneously forming a passivation film on the metal film, the second display film being made from a same material as the external connection terminals, and the passivation film being made from the same material as the external connection terminals.

4. The manufacturing method according to claim 3, wherein the metal film, the first display film, the second display film, and the passivation film are formed using photolithography.

5. The manufacturing method according to claim 3, wherein the metal film and the passivation film are formed using a first mask, and the first display film and the second display film are formed using a second mask.

6. The manufacturing method according to claim 1, wherein the identification information includes at least one selected from a group consisting of a manufacturer, kind of a product, name of the product, a lot number, type of the product, size of the product, and place of production.

7. The manufacturing method according to claim 3, wherein the second display film has a plurality of second through holes that are associated with the plurality of first through holes respectively.

8. The manufacturing method according to claim 1, wherein the identification information include a two-dimensional bar code.

9. The manufacturing method according to claim 1 further including providing a second passivation film on the semiconductor substrate between said preparing the semiconductor substrate and said providing the connection pads, wherein the second passivation film has a plurality of holes to receive the connection pads.

10. A semiconductor device comprising:
a semiconductor substrate provided with an integrated circuit;
connection pads provided on the semiconductor substrate;
a dielectric film provided on the semiconductor substrate and the connection pads, and having first contact holes through which the connection pads are exposed;
connection wires having a predetermined pattern on the dielectric film such that the first contact holes are filled with the connection wires and the connection wires are electrically connected to the connection pads;
a surface resin layer provided to cover the connection wires, the surface resin layer having second contact holes, through which surfaces of the connection wires are partially exposed, in a region corresponding to the perimeter of the semiconductor substrate;
a metal film provided to cover at least bottoms of the second contact holes;
external connection terminals formed on the metal film; and
a display unit formed on the surface resin layer in a region surrounded by the metal film and the external connection terminals, the display unit having a plurality of through holes that represent identification information.

11. The semiconductor device according to claim 10, wherein the display unit includes a thin film made of the same material as the metal film.

12. The semiconductor device according to claim 11, wherein the display unit has a two-layer structure, and one layer of the display unit is a thin film made of the same material as the external connection terminals.

13. The semiconductor device according to claim 10, wherein the metal film prevents diffusion of heat from metal elements included in the connection wires and the external connection terminals.

14. The semiconductor device according to claim 10, wherein the identification information includes at least one selected from a group consisting of a manufacturer, kind of a product, name of the product, a lot number, type of the product, size of the product, and place of production.

15. The semiconductor device according to claim 10, wherein the identification information include a two-dimensional bar code.

16. The semiconductor device according to claim 10 further including a second passivation film on the semiconductor substrate and having a plurality of holes to receive the connection pads.

17. A manufacturing method of a semiconductor device, comprising:
preparing a semiconductor substrate having an integrated circuit;
providing a plurality of connection pads on the semiconductor substrate;
forming a dielectric film having a plurality of first contact holes, through which the connection pads are exposed, on the semiconductor substrate and the connection pads;
forming connection wires having a predetermined pattern on the dielectric film such that the first contact holes are filled with the connection wires and the connection wires are electrically connected to the connection pads;
forming a surface resin layer over the connection wires, the surface resin layer having a plurality of second contact holes, through which surfaces of the connection wires are partially exposed, in a region corresponding to a perimeter of the semiconductor substrate; and
forming a metal film over at least bottoms of the second contact holes, and simultaneously forming a display unit having a plurality of first through holes to represent identification information in a region corresponding to a center area of the semiconductor substrate on the surface resin layer.

18. The manufacturing method according to claim 17, wherein the display unit is made from a same material as the metal film.

19. The manufacturing method according to claim 17, wherein the metal film and the display unit are formed using photolithography.

20. The manufacturing method according to claim 17, wherein the identification information includes at least one selected from a group consisting of a manufacturer, kind of a product, name of the product, a lot number, type of the product, size of the product, and place of production, and/or a two-dimensional bar code.

* * * * *